United States Patent [19]

MacDonald et al.

[11] 4,245,274

[45] Jan. 13, 1981

[54] READOUT AND CIRCUIT BOARD WITH TEST ACCESS

[75] Inventors: Douglas B. MacDonald, Des Plaines; Desi de Perczel, Chicago, both of Ill.

[73] Assignee: Bally Manufacturing Corporation, Chicago, Ill.

[21] Appl. No.: 3,474

[22] Filed: Jan. 15, 1979

Related U.S. Application Data

[63] Continuation of Ser. No. 832,335, Sep. 12, 1977, abandoned.

[51] Int. Cl.³ .............................................. H05K 7/18
[52] U.S. Cl. ................................ 361/429; 339/150 B; 361/392; 361/399; 313/519; 340/719
[58] Field of Search ............... 361/331, 380, 392, 395, 361/417–419, 399, 429; 339/147 P, 149 P, 150 B; 340/718, 719, 757, 762, 774; 313/312, 519

[56] References Cited

U.S. PATENT DOCUMENTS

| | | | |
|---|---|---|---|
| 2,958,065 | 10/1960 | Flanagan | 339/150 B |
| 3,270,252 | 8/1966 | Iversen | 361/399 |
| 3,631,299 | 12/1971 | Meyer | 361/399 |
| 3,858,073 | 12/1974 | Kohyama | 313/519 |
| 3,918,053 | 11/1975 | Towne | 340/757 |
| 4,092,698 | 5/1978 | Brefka | 361/399 |
| 4,159,506 | 6/1979 | Latasiewicz | 361/399 |

Primary Examiner—Gerald P. Tolin
Attorney, Agent, or Firm—Callard Livingston

[57] ABSTRACT

An electronic readout assembly in which the readout unit is captured in a frame which is secured in upright display position on a circuit board which in turn is slideably seated in a bracket adapted for utilization mounting, the readout being of the flat plate type having an array of contact prongs projecting from a bottom edge thereof, and the frame having a bottom opening through which the prongs engage with circuit connections on the circuit board. The frame also has open portions which expose the prongs to convenient access for test purposes in a region between the frame and circuit board.

11 Claims, 12 Drawing Figures

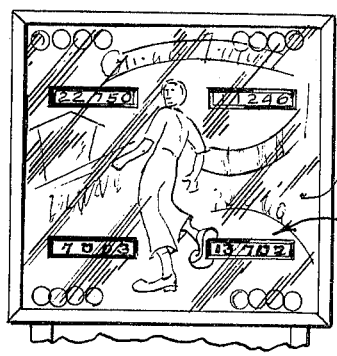
Fig. 1.
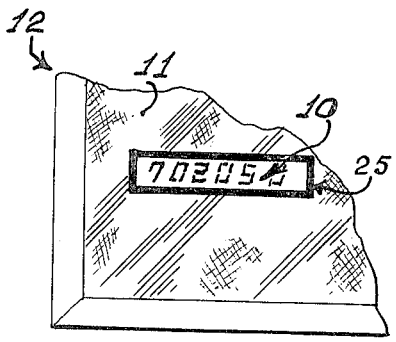
Fig. 2.
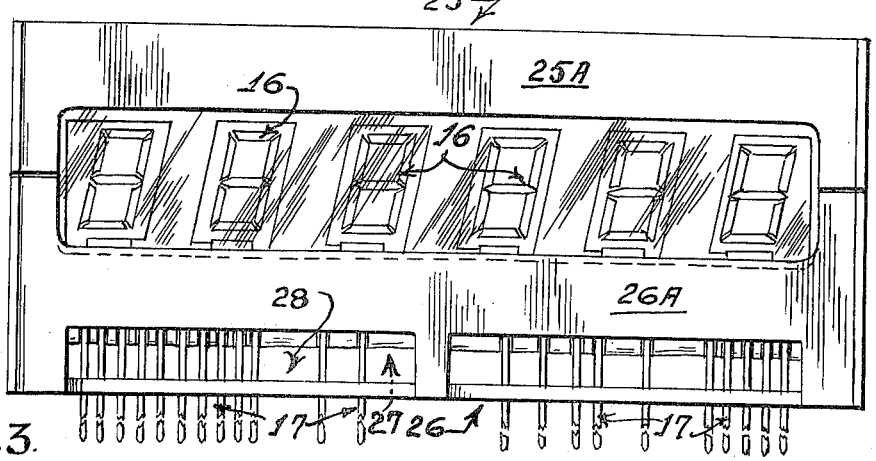
Fig. 3.
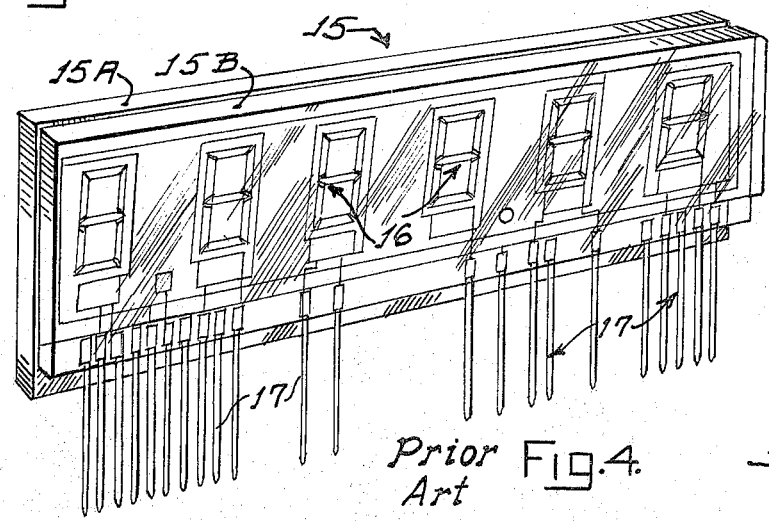
Prior Art   Fig. 4.
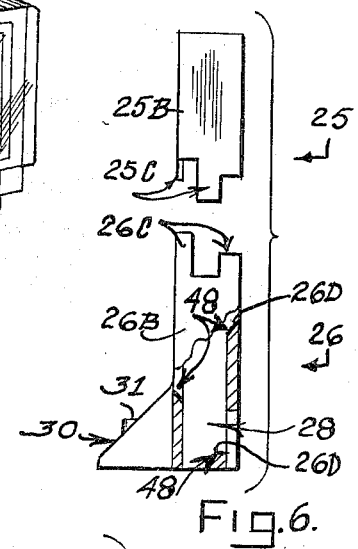
Fig. 6.
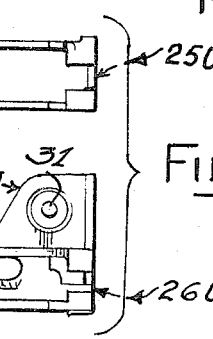
Fig. 5.

READOUT AND CIRCUIT BOARD WITH TEST ACCESS

This is a continuation of application Ser. No. 832,335, filed Sept. 12, 1977, and now abandoned.

The invention provides a combination mounting holder and masking display frame for an electronic readout device of the type in which a plurality of individually energizable digit-forming electrodes are sandwiched in digit-forming sets between transparent glass plates in a thin, rectangular configuration such that a plurality of luminous digits, for example six, can be formed selectively to display a six-digit number. Such readout devices commonly have a plurality of thin terminal conductors connecting with the internal electrode elements and extending outwardly from one of the long edges of the glass plate assembly or envelope for connection into a control circuit either by insertion into a gang connecting socket or with individual circuit conductors.

Readout devices of the type described are to greater or lesser degree frangible and require mounting means in some form to support them in operative display position and preferably also afford edgewise protection, especially along the margins of the glass-plate sandwich which is susceptible to chipping and fracture.

In accordance with the invention a combination mounting and display frame is provided wherein complementary interfitting frame members of molded plastics material have channeled bordering arms which fit over and encase the edges of the glass-plate readout envelope and provide a bordering mask thereabout with a substantial sight opening on one side exposing the digital display and other substantial open portions on the rearward side exposing the constituent internal electrode array and printed-circuit connections, along with other open portions exposing electrode terminals for inspection and testing access and to accommodate projecting structural appendages on the rearward face of the plate assembly, such as a vacuum exhaust and charging seal-off duct inherently present in such devices, the frame further providing a bottom opening through which the electrode terminals project, together with still other configurations defining mounting pedestals whereby the readout frame can be positioned behind a display window in the backglass of an amusement game or the like, the frame arms being flat and oversized in respect to such display window so that any gaps due to misalignment of the readout assembly with the window will be blocked and rendered inconspicuous by the frame.

In accordance with a further feature of the invention, the side arms of the complementary frame sections have interfitting keying configurations which are shaped to interfit in only one way so that the frame members can be joined only in the proper relationship and without prominence of the joints at the front face of the frame.

The foregoing and other aspects of novelty and utility will be further understood from the following description taken with the accompanying drawing in which:

FIG. 1 is a front view of the score-light-up backbox and backglass of an amusement game apparatus in which the digital readout device is used to display score values;

FIG. 2 is a magnified fragmentary detail of a display window on the backglass shown in FIG. 1;

FIG. 3 is a front elevation of the frame structure in assembly with a readout unit;

FIG. 4 is a front perspective view of the readout unit alone;

FIG. 5 is a composite view looking into the edge receiving the channeled portions of each of the upper and lower frame sections;

FIG. 6 is an exploded side view showing the frame members in separated relation and the polarizing assembly configurations with parts in section.

Figure 7:
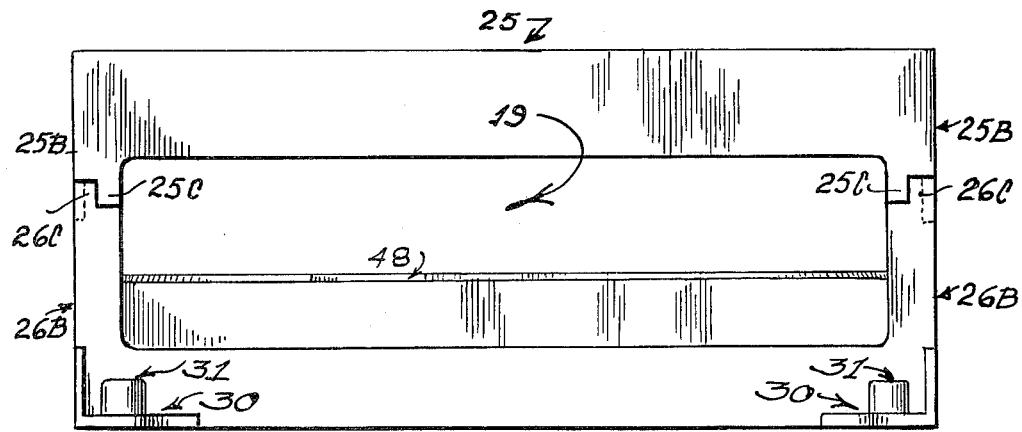
FIG. 7 is a rear elevational view of the assembled frame structure with the readout unit omitted.

Referring to FIG. 1, the combination readout supporting and masking frame structure has as one of its principal applications the mounting of the described digital display devices in relation to a sight opening or window 10 formed in the usual silk-screened artwork provided on the backglass 11 of the score-display backbox 12 in an amusement apparatus, such as a pinball or flipper game, there being usually several such display units provided in each game to register different aspects of the scoring possibilities and progress.

The digital readout device itself may be of a known type, such as depicted in FIG. 4, comprising a relatively thin, flat and elongated glass envelope 15 which may be formed by a pair of superposed glass plates 15A, 15B, fused or sealed together in a sandwich with a very shallow ionization cavity formed therebetween in which are situated a plurality of linear electrodes 16 arranged in arrays constituting digit-forming sets each capable of luminously delineating, when selectively energized, any of the digits from one through nine and zero for numeric display at the appertaining window 10 in the backglass 11 (FIGS. 1 and 2), such selective energization being effected through connections of the several electrode terminal fingers or conductors 17 into the usual score control circuitry of the game apparatus (not shown).

Readout devices of the class described will commonly include on the rearward face of the envelope a protuberant evacuation and charging seal-off nipple 18 by means of which an ionizable gas, such as Neon, will be introduced into the cavity, and the frame structure at its rearward side accordingly provides an enlarged open space 19 which will accommodate these exhaust seals with allowances for variations in placement thereof during manufacture, while generally exposing the rearward side of the entire electrode array and internal printed circuit array to general observation for servicing and inspection purposes.

For reasons related to the structural requirements of the readout unit itself, the electrode terminals 17 are formed of very thin, ductile metal projecting as elongated flexible fingers from the lower edge of the glass envelope or sandwich along the length thereof, these slender extensions being very easily bent and deformed to the extent of possible short-circuiting contact with one another by rough handling. Moreover, the edges of the glass plate assembly, particularly in the region of the entry of the slender connecting terminals into the cavity, are susceptible to accidental chipping and cracking with the possible result of admission of air into the ionization cavity and rendering the device inoperative, by reason of which it is an important function of the frame structure to encase and shield these and all edge portions and also to provide a flat, overlapping border mask in these areas affording an aesthetic visual registry of the readout frame assembly as a whole with the margins of the backglass display windows 10 opposite which they are intended to be positioned so that no unsightly gaps are created due to lack of precise registration of the readout unit in mounting it behind the glass panel, whereby assembly time is saved in the manufacture of the games and the frangible glass readout units themselves are protected for general handling in the production process.

As seen in FIGS. 3, 5 and 6, the protective mounting and masking display frame structure comprises upper and lower mating frame sections 25 and 26 which are molded from relatively soft plastics materials which may be of a type available under the Trademark "NORYL SE-1" in configurations which provide in each frame arm of each section respective elongated horizontal portions or arms 25A and 26A of channeled cross section, each terminating at opposite ends in respective short side arms 25B and 26B at the ends of each of which are formed complementary keying or polarizing configurations 25C and 26C adapted (FIGS. 6 and 7 particularly) to interfit in assembly in only one way and to form joints which are inconspicuous especially at the front of the frame structure, as in FIG. 2, these joints preferably being fixed by means such as heat sealing or cementing after insertion of the appertaining readout unit with its edges encased in the bordering frame arms, whereby the edge regions of the readout envelope are protected and substantially masked for the described alignment and misalignment purposes mentioned.

The bottom wall 25D of the upper horizontal frame channel is closed but that of the lower channel is provided with a wide terminal passage 27 extending substantially the length thereof, as in FIG. 5, and affording a passage for the array of long terminal fingers 17 in the manner depicted in FIG. 3; and in addition, a face portion of the lower frame section along the horizontal extent thereof immediately adjoining said terminal passage affords a window opening 28 exposing the terminal tabs or fingers at their point of entry into the lower edge of the readout unit for purposes of visual inspection and testing access when the complete readout and frame structure is in operative assembly, with remaining portions of the terminal tabs 17 inserted in a socket (not shown) or into a printed circuit board, as will appear.

Figure 8:
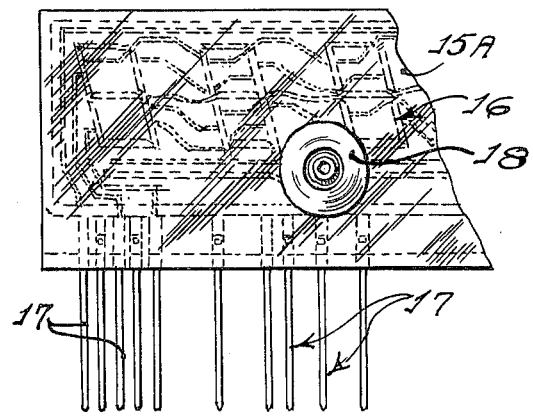
FIG. 8 is a fragmentary rear view of the readout unit showing the protuberant exhaust and charging seal-off nipple which must be accommodated by the frame.

As seen in FIG. 7, the rearward side of the assembled frame structure (which omits the readout device in the view of this Figure) is provided with a large open area 19 for exposing the rearward aspect of the electrode arrays and usual internal printed-circuit connections and the associated terminal fingers, this opening affording in addition a space to accommodate the evacuation seal 18 with allowance for considerable latitude in its manufacturing placement or misplacement on the glass envelope, FIG. 8.

Also formed at the rearward side of the lower frame member at opposite ends thereof, as in FIG. 7, are laterally-projecting mounting pedestals 30 each provided with a bore 31 for passage of mounting screws by means of which the entire readout assembly can be fixed in position before the backglass display window with its corresponding circuit panel.

The tolerable misalignment between the bordering portions of the respective readout frames in relation to the margins of the backglass display windows before which they are intended to be positioned, is enhanced if the plastics materials of which the frame structures are formed are colored to match some predominant color employed on the backglass screening, or if the plastics material is of black color, any exposed portions of the frame in either case being effective to render any reasonable degree of misalignment relatively inconspicuous, thereby eliminating the necessity for exact placement of the readout devices in operative alignment with the windows, which is a significant advantage of the frame structures in addition to their protective contribution and mounting function with exposure of electrical connections to the electrodes for testing purposes. For such reasons, the front faces of the bordering frame arms are made flat and will preferably be molded with a matte finish to augment the gap-obscuring misalignment function of the frame.

Figure 9:
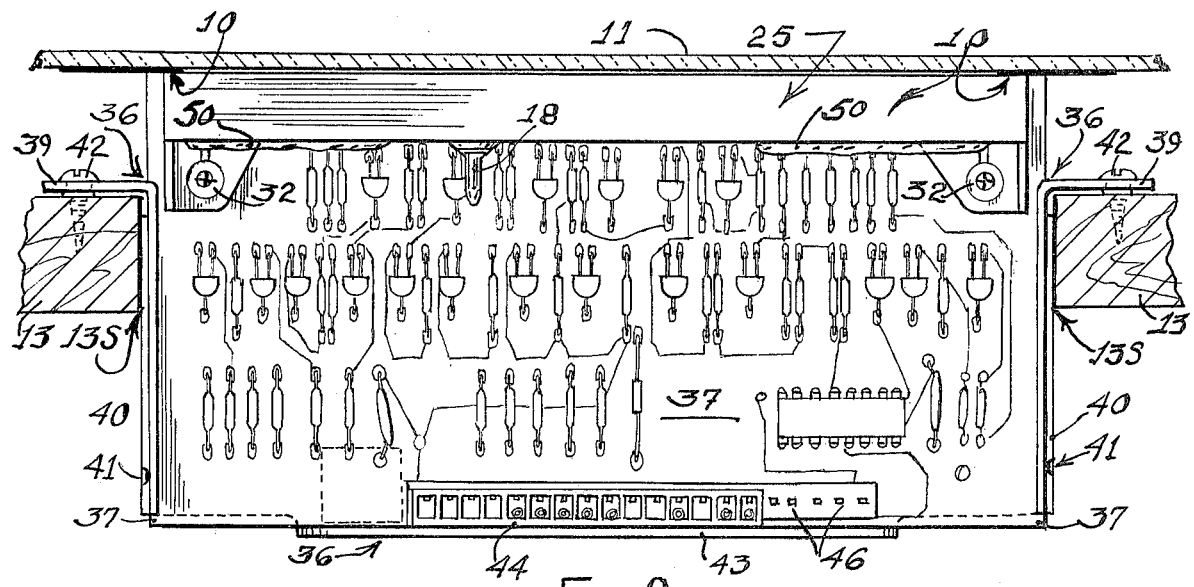
FIG. 9 is a top plan view of the readout and frame in assembly with a circuit board bracket at the backbox light panel.
Figure 10:
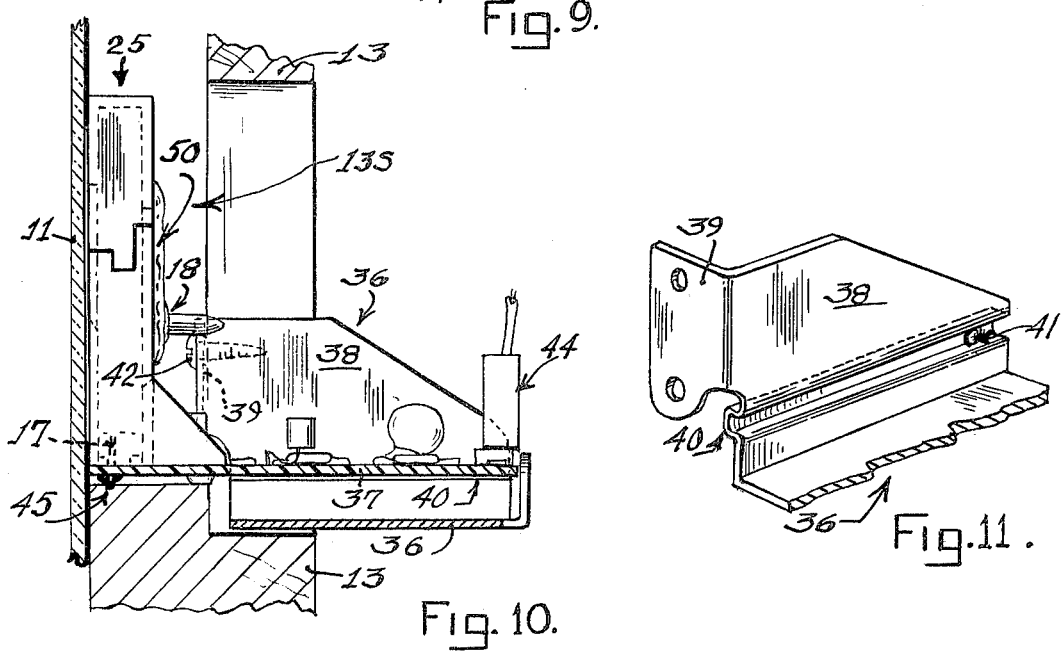
FIG. 10 is an assembly end view of the readout unit, mounting bracket, and printed circuit board with cabinet parts in section.
Figure 11:
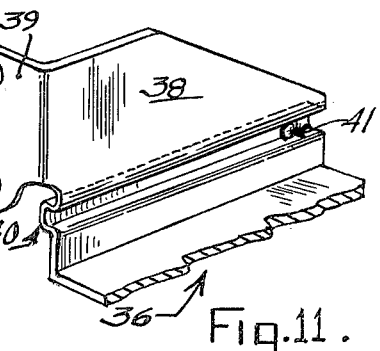
FIG. 11 is a fragmental perspective detail of an end portion of the mounting bracket to enlarged scale.
Figure 12:
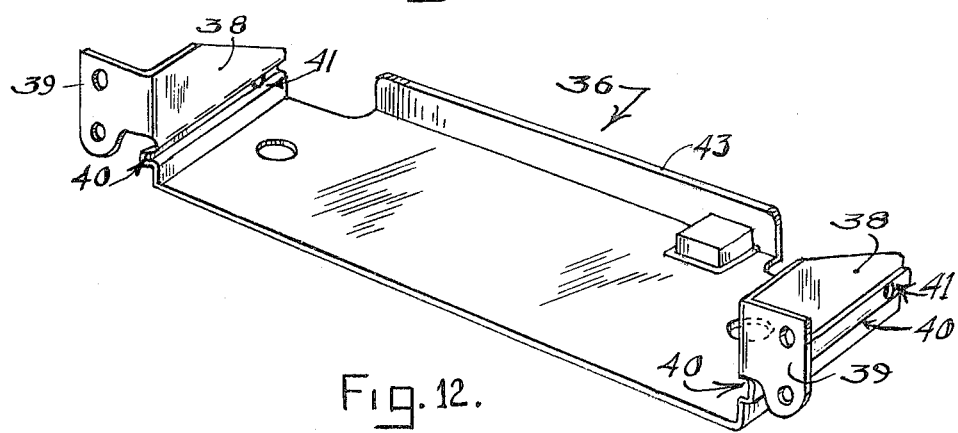
FIG. 12 is a perspective view of the entire mounting bracket.

A special bracket means 36, seen in FIG. 12, is provided to join the frame and its readout unit with appertaining control circuitry in the form of a printed circuit panel 37, as in FIGS. 9 and 10, the bracket means comprising a unitary metal stamping formed with identical upset end walls 38 each having an offset mounting wing 39 and circuit-board receiving channels 40 in which is an inwardly projecting dimple 41 serving as a frictional retaining means to hold the printed circuit board 37 when inserted into these channels (FIG. 9).

An upstanding, rearward flange 43 provides a rigidifying wall along the rearward margin of the circuit board.

In the illustrative embodiment, the pedestal projections or mounting feet 30 on the readout frame structure are fastened onto the circuit board by screws 32, and the projecting ends of the electrode terminals 17 are received in connection holes along the proximate edge of the circuit board and soldered, as at 45, FIG. 10.

As seen in FIGS. 5 and 6, the horizontal edges at 48 of the cross webs of the lower frame sections which lie just above the prong passage 27 and the test-probe access opening 28, are provided with a gliding bevel 26D at about 45° so that the free ends of the terminal prongs or tabs 17 will be deflected when fitted into the frame for entry into the bottom passage 27 and their respective circuit board holes underlying said passage, as at 45, FIG. 10.

The combined readout unit, frame, circuit board and bracket assembly is mounted behind the backglass 11 in the manner illustrated in FIGS. 9 and 10, wherein the usual plywood light board 13, which is hingedly positioned behind the backglass 11 is known manner, will be supplied with the required number of sight openings 13S for the digital display units used, each of which will register with a corresponding display window 10 in the silk-screened artwork on the backglass 11.

The complete readout assemblies, including their brackets 36, will be inserted through the forward sides of the corresponding sight openings 13S in the wood light board, and their appertaining bracket wings 39 will be set thereon by means of screws 42 with the readout frame 25 itself standing forward to confront the rearward side of the backglass in registration with the corresponding display 10 therein when the light panel is closed toward the rear face of the glass, there being provided for such purposes a clearance space of approximately three-quarters inch between the backglass and the wood panel, which also accommodates the usual shadowbox arrangements surrounding various light-up lamps in known manner, the respective printed circuit panels 37 projecting rearwardly on into the backbox cavity where they are accessible for inspection and connection with other circuit components by means of a cable and connector plug 44 engaging upstanding terminal prongs 46 on the circuit board, FIGS. 9 and 10.

In certain installations, the two half-sections of the plastic frame structure will be secured together by a blob of semi-permanent adhesive 50 such as silicone rubber cement, as in FIGS. 9 and 10, which can be forced to yield for servicing purposes in substitution for the more permanent cementing or fusing of the frame sections elsewhere referred to in view of FIG. 6.

In addition to the advantages afforded by exposure of the electrode terminals to test probe access where such terminals are more or less permanently engaged with circuit terminals on the associated circuit board or panel, and the further advantageous protective encasement of the frangible edges of the readout unit, the protective masking border of the channel sidewall on the display side of the readout unit afforded by the substantial depth of the channels, makes it unnecessary to locate the assembly precisely relative to the predetermined area allowed for a sight opening or viewing window area of the backglass, and this feature is of considerable practical and cost significance in machines of the class described wherein a movable inner panel supports the equipment to swing into and from operative position behind the backglass, especially where there may be a number of such readout units to be positioned before respective display windows, and they must be movable for servicing after original installation. In such respects also the easy removability of the frame structure and its associated circuit board from its supporting chassis is of value from the standpoint of servicing as well as production costs.

We claim:

1. An electronic readout assembly comprising a readout unit of the flat plate type containing display electrodes and having terminal fingers extending therefrom along an edge thereof for connection with control circuitry; a circuit board having circuit means operative to control energization of the readout display through connection with said terminal fingers established on the circuit board at predetermined positions thereon aligning with said fingers in the assembled condition of the readout with the circuit board; and a frame structure operative to support said readout unit on said circuit board with said fingers respectively in operative alignment with corresponding connection points on the board, said frame structure comprising complementary frame sections each including a horizontal cross arm from opposite ends of which depend a side leg, said legs having free ends each meeting with the free end of a correspondingly positioned leg on the other section in the assembly of said sections to define the frame, said cross arms and legs each having channel portions adapted to fit over edge portions of the readout unit to mask such edge portions including the edge portions from which the fingers project as aforesaid; a lower one of said sections having mounting configurations supportably engaging with said circuit board and with the fingers positioned in alignment with the respective connection points as aforesaid, said lower frame section further having an open access portion adjacent said circuit board to expose portions of said fingers for test purposes.

2. An electronic readout and circuit board structure of the type wherein character-forming electrodes are contained in a substantially flat plate-type envelope from which terminal tabs project from a margin thereof for connection with control circuit means, and the readout unit is supported on an appertaining circuit board having a plurality of connection points respectively engaging with one of said tabs in a predetermined positioning of the readout relative to the board, characterized in that: the readout is supportably positioned on the circuit board by frame means comprising upper and lower mating frame sections each comprising a horizontal cross arm having opposite ends from each of which projects a side leg, said arms and legs being channeled to fit over the marginal edge portions of the readout in assembly therewith, said legs having free ends respectively meeting with the free ends of correspondingly positioned legs in assembly as aforesaid whereby said arms and legs form a bordering mask around said edge portions and define a viewing window of large expanse through which the readout display is visible, the lower one of said sections having mounting configurations engaging said board and positioning the frame structure with said tabs in cooperative alignment and engagement with corresponding connection points on the board, the lower frame cross arm having open portions underlying said tabs to permit projection of the tabs into engagement with said connection points, and said section further having an access window juxtaposed with portions of said tabs to expose the latter for test engagement.

3. Electronic numeric display readout apparatus comprising a readout unit of the flat plate type housing character-forming electrodes with activating contact fingers projecting therefrom into space along an edge of the unit for connection with control circuitry; a circuit panel having circuit terminal means with which said fingers are to be connected, and a frame structure embracing and supporting the readout unit in substantially upright position upon said panel, said frame structure including plate-bordering frame members extending completely about the marginal edge portions of said readout unit and having internally-recessed portions enclosing, concealing and protecting said edge portions, that particular frame member which embraces the side of the readout unit from which the contact fingers project as aforesaid having open passage portions permitting passage therethrough of said contact fingers to extend beyond the particular frame member to said panel for engagement with the circuit terminal means thereon as aforesaid; and mounting means including portions of the frame structure securing the frame structure on the panel in the position aforesaid.

4. Apparatus according to claim 3 further characterized in that said frame structure includes open test-window portions in the said particular frame member extending in adjacency to the edge of the readout unit from which the contact fingers project as aforesaid and exposing to access portions of said fingers for engagement by test probes or the like.

5. Apparatus according to claim 3 further characterized in that said mounting means includes laterally-projecting integrally-conformed portions of the frame structure situated in adjacency to the said particular frame member and fitting upon said panel to support the frame structure and contained readout unit in substantially upright position thereon with said contact fingers in cooperative alignment and engagement with the circuit terminal means thereon as aforesaid.

6. In alpha-numeric type electronic display apparatus of the type employing a readout unit comprising a flat glass envelope containing readout electrodes from which contact fingers extend through and along an edge of the envelope for connection with circuit means, the improvements which comprise: a circuit panel having terminal connection points for engagement with said contact fingers; a frame structure supportably engaging the readout unit and comprising bordering arms recessed internally to fit upon the marginal edges of the readout unit, including the edge thereof from which the contact fingers project as aforesaid, and to extend about the entire periphery of said unit and define on at least one side of said unit a viewing window of large expanse exposing the readout character display, one of said bordering arms seated upon the surface of said circuit panel and having open portions on that side thereof which confronts the panel and through which said contact fingers project into engagement respectively with appertaining terminal connection points on the panel as aforesaid; and securing means engaging a part of the frame structure and the panel operative to secure the frame structure and included readout unit rigidly in position on the panel as aforesaid.

7. An electronic readout and circuit board assembly utilizing a known type of thin, plate-like electro-luminous readout unit containing character-forming elements selectively energizable to form variant readout configurations visible through at least one readout face of the unit and energizable via contact appendages extending along an edge region of the unit, said assembly comprising, namely: a frame structure supportably engaging with marginal edge portions of the unit and defining at least one large window area confronting the plane of the readout face of said unit exposing such configurations to view, a portion of the frame structure confronting the edge portions of the unit along which said contact appendages extend and having open portions to provide a connection passage confronting said appendages for interconnection with cooperative circuit means; said frame structure in a region adjoining both said window area and connection passage portions having further open areas defining test-access portions confronting said contact appendages and exposing the latter for engagement individually by test probe means; cooperative circuit means including a circuit panel having readout circuit components thereon and appertaining electrical connection terminals arranged in a predetermined pattern thereon for respective alignment with corresponding contact appendages of the readout unit when the latter is disposed in a certain cooperative orientation with the panel and terminals; means supporting said frame structure and the included readout unit on said panel in the oriented position aforesaid with said contact appendages and terminals in electrical interconnection; and support means engaging with said panel and serving to support said assembly for utilization purposes.

8. The combination of claim 7 further characterized in that said support means comprises a one-piece bracket with slideways slideably receiving and seating edge portions of said panel such that the bracket and panel lie is one plane of reference and the readout unit stands in a viewing plane substantially at right angles to the reference plane.

9. A luminous electronic readout assembly of the type employing a flat translucent envelope containing readout elements energizable via contact prongs projecting in a linear array along edge portions of the unit in a plane containing the envelope, said assembly being characterized in that the readout unit is carried in a circumambient frame embracing the margins of the unit, said frame being disposed in upright position upon a circuit panel having readout circuit components thereon with circuit terminals arranged linearly for respective engagement with corresponding contact prongs on the readout in assembly with the panel, said frame having at least one window portion confronting a face of the unit and exposing the readout configurations to view, and further passage portions confronting said panel and through which the prongs extend for engagement with said terminals, together with open access portions in a region between the panel and the edge of the readout unit from which said prongs project and situated in juxtaposition with the array of contact prongs to expose the latter for engagement by test implements.

10. An electronic readout assembly wherein a readout unit of the flat plate type has outwardly extending contact tabs arranged serially along an edge thereof together with a cooperative circuit board having aligned terminals respectively engaged by said tabs in an assembled condition of the unit therewith, in which the readout unit stands approximately at right angles to the board with the contact-tab edge thereof proximate to the board and the tabs aligned in engagement with said board terminals, characterized in that the readout unit is embraced in a bordering frame structure including contiguous bordering arms extending circumambiently about the peripheral edges of the readout unit and having channeled portions fitting over said edges to contain the same and provide a bordering mask framing the readout display area, that particular one of said arms which is proximate to the confronting face of the circuit board having open tab-passage portions confronting the board and said terminals thereon and through which said tabs project beyond said particular arm for engagement with the terminals as aforesaid, said particular arm further having open test window portions adjoining said tab-passage portions and affording test-probe access to said tabs in a region thereof which lies between their emergence from said readout unit edge and the margin of said particular arm which proximately confronts the circuit board.

11. A readout assembly according to claim 10 further characterized in that said frame structure is provided in a region thereof adjoining said particular arm with support configurations seating upon said circuit board.

* * * * *